US010707901B2

(12) United States Patent
Palangappa et al.

(10) Patent No.: US 10,707,901 B2
(45) Date of Patent: Jul. 7, 2020

(54) DIE-WISE RESIDUAL BIT ERROR RATE (RBER) ESTIMATION FOR MEMORIES

(71) Applicant: Intel Corporation, Santa Clara, CA (US)

(72) Inventors: Poovaiah M Palangappa, San Jose, CA (US); Ravi H. Motwani, Fremont, CA (US); Santhosh K. Vanaparthy, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/242,155

(22) Filed: Jan. 8, 2019

(65) Prior Publication Data
US 2019/0140660 A1 May 9, 2019

(51) Int. Cl.
*H03M 13/11* (2006.01)
*G06F 11/10* (2006.01)
(Continued)

(52) U.S. Cl.
CPC ..... *H03M 13/1125* (2013.01); *G06F 11/1012* (2013.01); *G06F 11/1048* (2013.01);
(Continued)

(58) Field of Classification Search
CPC .......... H03M 13/1125; H03M 13/1117; H03M 13/3723; H03M 13/6325; H03M 13/658;
(Continued)

(56) References Cited

U.S. PATENT DOCUMENTS

2006/0020869 A1\* 1/2006 Desai ............... H03M 13/2909
714/752
2008/0077843 A1\* 3/2008 Cho .................. H03M 13/1114
714/801

(Continued)

OTHER PUBLICATIONS

Kanistras et al., Propagation of LLR Saturation and Quantization Error in LDPC Min-Sum Iterative Decoding, IEEE, Conference Paper, pp. 1-6 (Year: 2012).*

(Continued)

*Primary Examiner* — April Y Blair
*Assistant Examiner* — Dipakkumar B Gandhi
(74) *Attorney, Agent, or Firm* — Compass IP Law, PC

(57) ABSTRACT

Examples include techniques for improving low-density parity check decoder performance for a binary asymmetric channel in a multi-die scenario. Examples include logic for execution by circuitry to decode an encoded codeword of data received from a memory having a plurality of dies, bits of the encoded codeword stored across the plurality of dies, using predetermined log-likelihood ratios (LLRs) to produce a decoded codeword, return the decoded codeword when the decoded codeword is correct, and repeat the decoding using the predetermined LLRs when the decoded codeword is not correct, up to a first number of times when the decoded codeword is not correct. When a correct decoded codeword is not produced using predetermined LLRs, further logic may be executed to estimate the LLRs for a plurality of buckets of the plurality of dies, normalize magnitudes of the estimated LLRs, decode the encoded codeword using the normalized estimated LLRs to produce a decoded codeword, return the decoded codeword when the decoded codeword is correct, and repeat the decoding using the normalized estimated LLRs when the decoded codeword is not correct, up to a second number of times when the decoded codeword is not correct.

17 Claims, 2 Drawing Sheets

(51) Int. Cl.
 *G11C 29/04* (2006.01)
 *H03M 13/37* (2006.01)
 *H03M 13/00* (2006.01)
 *H03M 13/53* (2006.01)
(52) U.S. Cl.
 CPC .......... *G06F 11/1068* (2013.01); *G11C 29/04* (2013.01); *H03M 13/112* (2013.01); *H03M 13/1117* (2013.01); *H03M 13/3723* (2013.01); *H03M 13/6325* (2013.01); *H03M 13/658* (2013.01); *G11C 2029/0411* (2013.01)
(58) Field of Classification Search
 CPC .............. H03M 13/112; G06F 11/1012; G06F 11/1068; G06F 11/1048; G11C 29/04; G11C 2029/0411
 See application file for complete search history.

(56) References Cited

U.S. PATENT DOCUMENTS

| | | | | |
|---|---|---|---|---|
| 2009/0245426 | A1* | 10/2009 | Ratnakar | H04L 1/0045 375/327 |
| 2010/0088575 | A1* | 4/2010 | Sharon | G06F 11/1072 714/763 |
| 2010/0325514 | A1* | 12/2010 | Sugihara | H03M 13/112 714/752 |
| 2012/0207224 | A1* | 8/2012 | Chow | H03M 13/1111 375/240.25 |
| 2014/0143637 | A1* | 5/2014 | Cohen | H03M 13/1108 714/773 |
| 2015/0234706 | A1* | 8/2015 | Alrod | G06F 11/1072 714/704 |
| 2015/0358036 | A1* | 12/2015 | Tseng | H03M 13/1128 714/755 |

OTHER PUBLICATIONS

Wang et al., On the LLR criterion based shortening design for LDPC codes, IEEE, Conference Paper, pp. 1-6 (Year: 2016).*

Volkov et al., Flexible parallel implementation of LLR BP decoding simulation on multicores using OpenCL, IEEE, Conference paper, pp. 1-4 (Year: 2017).*

Wang et al., On the LLR criterion based shortening design for LDPC codes, IEEE, Conference Paper, Pertinent pp. 1-6 (Year: 2016).*

Leung et al., A more efficient and optimal LLR for decoding and verification, IEEE, vol. 2, Conference Paper, Pertinent pp. 689-692 (Year: 1999).*

* cited by examiner

DIE-WISE RESIDUAL BIT ERROR RATE (RBER) ESTIMATION FOR MEMORIES

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2018, Intel Corporation, All Rights Reserved.

TECHNICAL FIELD

Examples described herein are generally related to techniques for identifying bad dies in memories used in computing systems.

BACKGROUND

Low-density parity check (LDPC) codes are a class of linear block error correcting codes (ECCs). The name comes from the characteristic of their parity check matrix which contains only a few 1's in comparison to the amount of 0's. Their main advantage is that they provide an error correction performance that is very close to the capacity for many different types of channels and linear time complex algorithms for decoding. Furthermore, they are suited for implementations that make heavy use of parallelism.

In some computing systems, LDPC codes are used for communication of data to and from memory devices. LDPC decoders lose significant error correcting performance due to (1) asymmetry in the underlying channel, such as when interfacing with NAND flash memory and a type of non-volatile memory known as a three-dimensional cross-point memory (commercially available as 3D XPoint™ (3DXP) from Intel Corporation) and (2) failed dies, which make a section of the codeword to have high error rate in comparison to the rest of the codeword. In other words, the channel is known to behave as a binary asymmetric channel, which could flip 1's to 0's and 0's to 1's (e.g., generating errors in the data being communicated) with unequal probabilities and the channel can have different characteristics for different dies.

DETAILED DESCRIPTION

Embodiments of the present invention improve the decoding capability of LDPC decoders in the presence of an asymmetrical channel (such as one coupled to a NAND memory or a three-dimensional cross-point memory (e.g., 3D XPoint™ (3DXP) memory commercially available from Intel Corporation)). Embodiments of the present invention estimate cross-over probabilities (i.e., erroneous changes from 0 to 1 and from 1 to 0 in data bits), represented as log-likelihood ratios (LLRs), and leverage this information for improved min-sum decoding performance. Embodiments recover a majority of the performance that is lost by the decoder due to channel asymmetry, incur minimal area overhead since an existing min-sum infrastructure may be used for the estimation method, and has minimal-to-nil latency impact.

Error correcting codes (ECC) are employed to correct the bit errors in the memory that occurred between the data written to the memory and data read out from the memory. Both in 3DXP and NAND memories, a data codeword is stored across multiple dies, which can have different error characteristics due to process variation/traffic characteristics. Current ECC decoders do not have access to the information on the variation of the error characteristics, and hence resort to a uniform treatment of the data from different dies.

Embodiments of the present invention provide a low latency and low gate count solution to easily detect the residual bit error rate (RBER) of parts of the codeword that are from different dies. Since a codeword can be stored in multiple dies with varying RBER characteristics, embodiments can provide higher error correction performance, by estimating the RBER of each die separately.

Figure 1:
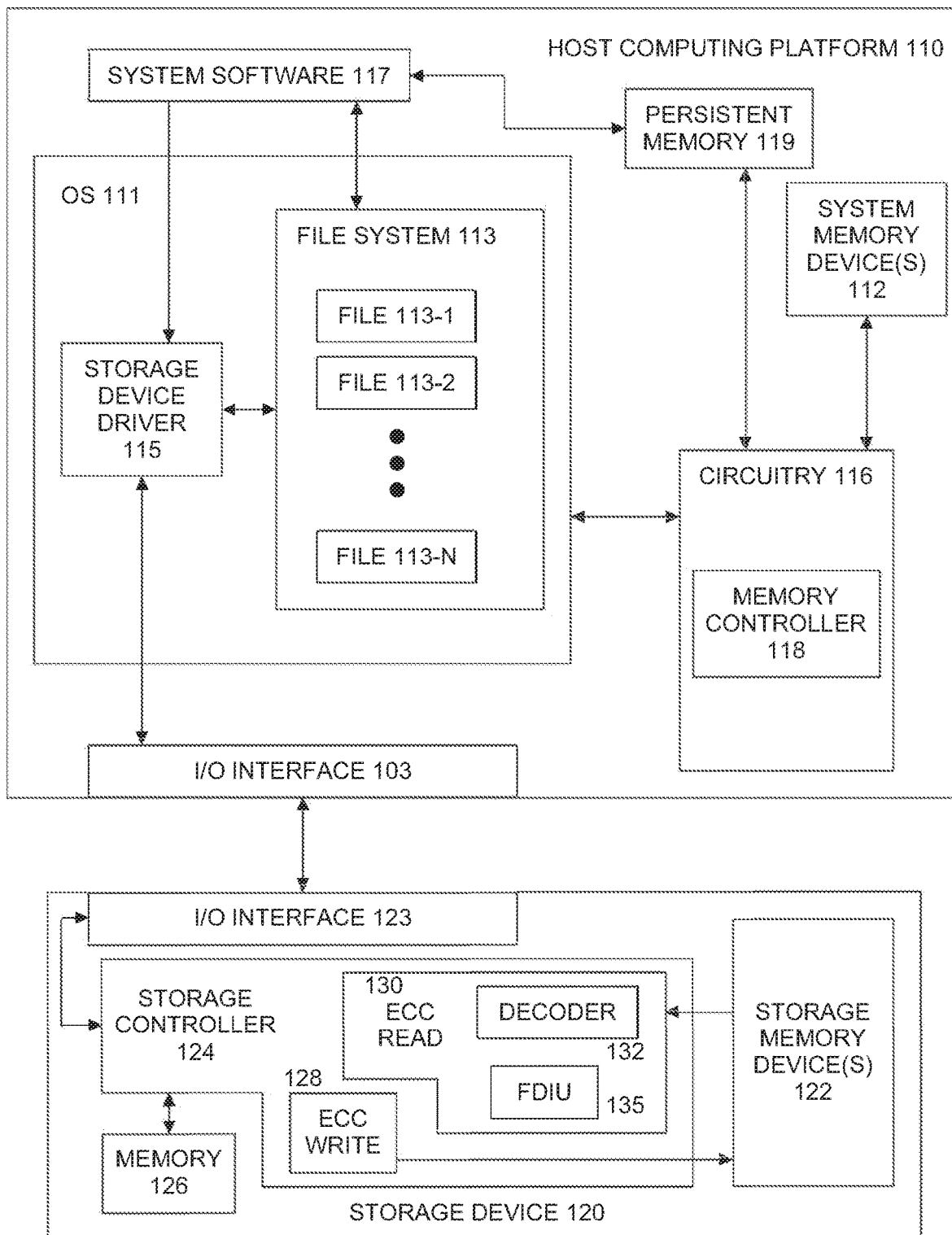
FIG. 1 illustrates an example first system.

FIG. 1 illustrates an example first system 100. System 100 includes a host computing platform 110 coupled to one or more storage device(s) 120 through I/O interface 103 and I/O interface 123. Host computing platform 110 includes an operating system (OS) 111, one or more system memory device(s) 112, circuitry 116 and system software 117. For these examples, circuitry 116 is capable of executing various functional elements of host computing platform 110 such as OS 111 and system software 117 that may be maintained, at least in part, within system memory device(s) 112. Circuitry 116 includes host processing circuitry to include one or more central processing units (CPUs) (not shown) and associated chipsets and/or controllers.

According to some examples, as shown in FIG. 1, OS 111 includes a file system 113 and a storage device driver 115 and storage device 120 includes a storage controller 124, one or more storage memory device(s) 122 and memory 126. OS 111 is arranged to implement storage device driver 115 to coordinate at least temporary storage of data for a file from among files 113-1 to 113-$n$, where "n" is any whole positive integer >1, to storage memory device(s) 122. The data, for example, may have originated from or may be associated with executing at least portions of system software 117 and/or OS 111, or application programs (not shown in FIG. 1).

As described in more detail below, OS 111 communicates one or more commands and transactions with storage device 120 to write data to and read data from storage device 120. The commands and transactions are organized and processed by logic and/or features at the storage device 120 to write the data to and read the data from storage device 120.

In some examples, storage controller 124 includes logic and/or features to receive a read transaction request or a write transaction request to storage memory device(s) 122 at storage device 120. For these examples, the write transaction is initiated by or sourced from system software 117 that may, in some embodiments, utilize file system 113 to write data to storage device 120 through input/output (I/O) interfaces 103 and 123. For these examples, the read transaction is initiated by or sourced from system software 117 that may, in some embodiments, utilize file system 113 to read data from storage device 120 through input/output (I/O) interfaces 103 and 123.

In some examples, memory 126 includes volatile types of memory including, but not limited to, RAM, D-RAM, DDR SDRAM, SRAM, T-RAM or Z-RAM. One example of volatile memory includes DRAM, or some variant such as SDRAM. A memory subsystem as described herein may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

However, examples are not limited in this manner, and in some instances, memory 126 includes non-volatile types of memory, whose state is determinate even if power is interrupted to memory 126. In some examples, memory 126 includes non-volatile types of memory that is a block addressable, such as for NAND or NOR technologies. Thus, memory 126 can also include a future generation of types of non-volatile memory, such as a three-dimensional cross-point memory (3D XPoint™), or other byte addressable non-volatile types of memory. According to some examples, memory 126 includes types of non-volatile memory that includes chalcogenide glass, multi-threshold level NAND flash memory, NOR flash memory, single or multi-level Phase Change Memory (PCM), a resistive memory, nanowire memory, FeTRAM, MRAIVI that incorporates memristor technology, or STT-MRAM, or a combination of any of the above, or other memory.

In some examples, storage memory device(s) 122 is a device to store data from write transactions and/or write operations. Storage memory device(s) 122 includes one or more chips or dies having gates that individually include one or more types of non-volatile memory to include, but not limited to, NAND flash memory, NOR flash memory, three-dimensional cross-point memory (3D XPoint™), ferroelectric memory, SONOS memory, ferroelectric polymer memory, FeTRAM, FeRAM, ovonic memory, nanowire, EEPROM, phase change memory, memristors or STT-MRAM. For these examples, storage device 120 may be arranged or configured as a solid-state drive (SSD). The data is read and written in blocks and a mapping or location information for the blocks is kept in memory 126.

According to some examples, communications between storage device driver 115 and storage controller 124 for data stored in storage memory devices(s) 122 and accessed via files 113-1 to 113-n is routed through I/O interface 103 and I/O interface 123. I/O interfaces 103 and 123 are arranged as a Serial Advanced Technology Attachment (SATA) interface to couple elements of host computing platform 110 to storage device 120. In another example, I/O interfaces 103 and 123 are arranged as a Serial Attached Small Computer System Interface (SCSI) (or simply SAS) interface to couple elements of host computing platform 110 to storage device 120. In another example, I/O interfaces 103 and 123 are arranged as a Peripheral Component Interconnect Express (PCIe) interface to couple elements of host computing platform 110 to storage device 120. In another example, I/O interfaces 103 and 123 are arranged as a Non-Volatile Memory Express (NVMe) interface to couple elements of host computing platform 110 to storage device 120. For this other example, communication protocols are utilized to communicate through I/O interfaces 103 and 123 as described in industry standards or specifications (including progenies or variants) such as the Peripheral Component Interconnect (PCI) Express Base Specification, revision 3.1, published in November 2014 ("PCI Express specification" or "PCIe specification") or later revisions, and/or the Non-Volatile Memory Express (NVMe) Specification, revision 1.2, also published in November 2014 ("NVMe specification") or later revisions.

In some examples, system memory device(s) 112 stores information and commands which may be used by circuitry 116 for processing information. Also, as shown in FIG. 1, circuitry 116 includes a memory controller 118. Memory controller 118 is arranged to control access to data at least temporarily stored at system memory device(s) 112 for eventual storage to storage memory device(s) 122 at storage device 120.

In some examples, storage device driver 115 includes logic and/or features to forward commands associated with one or more read or write transactions and/or read or write operations originating from system software 117. For example, storage device driver 115 may forward commands associated with write transactions such that data is caused to be stored to storage memory device(s) 122 at storage device 120. More specifically, storage device driver 115 can enable communication of the write operations from system software 117 at computing platform 110 to storage controller 124. For example, storage device driver 115 may forward commands associated with read transactions such that data is caused to be retrieved from storage memory device(s) 122 at storage device 120. More specifically, storage device driver 115 can enable communication of the read operations from system software 117 at computing platform 110 to storage controller 124.

System Memory device(s) 112 includes one or more chips or dies having volatile types of memory such RAM, D-RAM, DDR SDRAM, SRAM, T-RAM or Z-RAM. However, examples are not limited in this manner, and in some instances, system memory device(s) 112 includes non-volatile types of memory, including, but not limited to, NAND flash memory, NOR flash memory, three-dimensional cross-point memory (3D XPoint™), ferroelectric memory, SONOS memory, ferroelectric polymer memory, FeTRAM, FeRAM, ovonic memory, nanowire, EEPROM, phase change memory, memristors or STT-MRAM.

Persistent memory 119 includes one or more chips or dies having non-volatile types of memory, including, but not limited to, NAND flash memory, NOR flash memory, 3-D cross-point memory (3D XPoint™), ferroelectric memory, SONOS memory, ferroelectric polymer memory, FeTRAM, FeRAM, ovonic memory, nanowire, EEPROM, phase change memory, memristors or STT-MRAM.

According to some examples, host computing platform 110 includes, but is not limited to, a server, a server array or server farm, a disaggregated server, a web server, a network server, an Internet server, a work station, a mini-computer, a main frame computer, a supercomputer, a network appliance, a web appliance, a distributed computing system, a personal computer, a tablet computer, a smart phone, multiprocessor systems, processor-based systems, or combination thereof.

Data received by storage controller 124 is encoded prior to sending of the data to storage memory device(s) or memory 126. When storage controller 124 receives a write transaction request, storage controller 124 uses error correcting code (ECC) write component 128 to encode the data and write the encoded data to storage memory device 122.

In another embodiment, storage controller 124 uses ECC write component 128 to encode data stored in memory 126. In embodiments, ECC write component 128 uses a known low density parity check (LDPC) code.

When storage controller receives a read transaction request, or otherwise desires to retrieve encoded data from storage memory device 122 or memory 126, storage controller 124 uses ECC read component 130 to decode the encoded data in order to access the data. Specifically, ECC read component 130 uses decoder 132 and failed die identification unit (FDIU) 135 to identify a failed die and to decode the encoded data using the failed die information. In an embodiment, decoder 132 is a LDPC min-sum decoder. In an embodiment, FDIU 135 and decoder 132 are integral in one component within storage controller 124.

LDPC decoders, like the min-sum, sum-product, belief-propagation decoders, etc., make use of the soft information of the read bits (variable nodes) to improve the decoder performance. This information is provided to the decoder as log-likelihood ratios (LLRs) of the input codeword bits.

An LDPC codeword is the minimum granularity on which the decoding process takes place. Typically, for higher read/write throughput, a codeword can be distributed across several dies in both NAND and 3DXP memory technologies. The part of the codeword data from a given die has similar error probabilities. However, different parts of the codeword that are from different dies can have quite varying error probabilities. By correct estimation of the error probabilities of the data from different dies, the LDPC decoders can be provided with additional information for decoding. This improves the error correction performance.

In a binary symmetric channel, the cross-over probabilities (RBER) of '1's and 0's are the same; meaning, the probabilities of 1's getting flipped to 0's, and 0's getting flipped to 1's are the same. However, flash memory (such as memory 126 and/or storage memory device(s) 122)) may behave as a binary asymmetric channel, which could flip 1's to 0's and 0's to 1's with unequal probabilities. Furthermore, the crossover probabilities for 1's and 0's vary across the codeword depending on the die the codeword is stored in. Estimating these cross-over probabilities (hence log-likelihood ratios (LLRs)) and leveraging this information in decoder 132 enables an improved min-sum decoding performance. Note that the RBER and the LLR are related as follows:

$$LLR(y) = \ln\left(\frac{1 - rber(y)}{rber(y)}\right)$$

Note that for a soft read, for e.g., a 3-strobe read, the number of buckets is four, and the RBER of each bucket needs to be estimated to generate the LLRs of each bucket.

First, the RBER (or LLR) estimation of 0's and 1's is described for a given die. Subsequently, this is extended for estimating the RBER of each die.

Consider a binary asymmetric channel with RBER(0) and RBER(1), which are the raw-bit error rates (RBER) for the bits 0 and 1 respectively. The RBERs are related to LLRs through the relation:

$$LLR(y) = \ln\left(\frac{1 - rber(y)}{rber(y)}\right).$$

As a convention, the LLR of the bucket is chosen to be positive if the hard-bit for the bucket is 0, and vice versa. The process for LLR estimation (estimation of LLR=[LLR (0) LLR(1)]) for the hard read case is presented first and then extended to the soft read case.

Hard Read Case:

Let the set of indices of 0's and 1's in the error-free/written codeword be $S_0$ and $S_1$, respectively. Let the set of indices of 0's and 1's in the noisy/read codeword be $S'_0$ and $S'_1$, respectively. Then, the number of bits that flipped from 0's in the error-free codeword to become 1's in the noisy codeword is given by $S_0 \cap S'_1$. Similarly, the number of bits that flipped from 1's in the error-free codeword to become 0's in the noisy codeword is given by $S_1 \cap S'_0$. Thus, the RBERs of 1's and 0's are given by $$RBER(0) = p_{1 \to 0} \approx \frac{n(S_1 \cap S'_0)}{n(S'_0)} \quad (1a)$$

$$RBER(1) = p_{0 \to 1} \approx \frac{n(S_0 \cap S'_1)}{n(S'_1)} \quad (1b)$$

Note that $p_{1 \to 0}$ and $p_{0 \to 1}$ are posterior probabilities; $p_{a \to b}$ is the probability that some symbol written as a and was read as b. This is a measure of the reliability of the symbols that were read as b.

Correcting a noisy codeword using min-sum decoding involves iteratively flipping of bits using the messages exchanged between check nodes and variable nodes. Channel estimation is based on the premise that statistically, the majority of the flipping decisions made by decoder 132 is correct. Meaning, at the end of t iterations, the number of 0's in the received codeword that flipped to 1's in the partially-decoded codeword, $f_{0 \to 1}$, is proportional to $n(S_1 \cap S'_0)$. Similarly, the number of 1's in the received codeword that flipped to 0's in the partially-decoded codeword, $f_{1 \to 0}$, is proportional to $n(S_0 \cap S'_1)$. Thus, the LLRs can be estimated as follows:

$$RBER(0) = \frac{n(S_1 \cap S'_0)}{n(S'_0)} = k_0 \frac{f_{0 \to 1}}{n(S'_0)} \quad (2a)$$

$$RBER(1) = \frac{n(S_0 \cap S'_1)}{n(S'_1)} = k_1 \frac{f_{1 \to 0}}{n(S'_1)} \quad (2b)$$

$$LLR(0) = \log\left(\frac{1 - RBER(0)}{RBER(0)}\right) \quad (3a)$$

$$= \log\left(\frac{1 - \left(k_0 \frac{f_{0 \to 1}}{n(S'_0)}\right)}{k_0 \frac{f_{0 \to 1}}{n(S'_0)}}\right) \approx \log\left(\frac{1 - \frac{f_{0 \to 1}}{n(S'_0)}}{\frac{f_{0 \to 1}}{n(S'_0)}}\right) - \log(k_0)$$

$$LLR(1) = \log\left(\frac{1 - RBER(1)}{RBER(1)}\right) \quad (3b)$$

$$= \log\left(\frac{1 - \left(k_1 \frac{f_{1 \to 0}}{n(S'_1)}\right)}{k_1 \frac{f_{1 \to 0}}{n(S'_1)}}\right) \approx \log\left(\frac{1 - \frac{f_{1 \to 0}}{n(S'_1)}}{\frac{f_{1 \to 0}}{n(S'_1)}}\right) - \log(k_1)$$

Typically, $k_0$ and $k_1$ are close to 1, which makes $\log(k_0)$ and $\log(k_1)$ close to 0.

Thus, equations (3 a) and (3 b) provide a direct translation of bit flips to LLRs. These LLRs can be used as inputs to a second pass of min-sum decoding.

The min-sum decoding process of an embodiments accepts 16 as the maximum magnitude of the input LLRs.

Hence the LLRs need to be normalized to 16 before giving the LLRs to the min-sum decoder. This operation can be represented as $$[LLR(0)\ LLR(1)] \times \left(\frac{16}{\max(LLR)}\right).$$

Soft Read Case:

The soft read case is described using a three-strobe read as an example. A three-strobe read results in four buckets—high confidence 1 (a), low confidence 1 (b), low confidence 0 (c), and high confidence 0 (d). Here, the number of symbols that transitioned from every bucket to the opposite sign—$f_{a \to 0}$, $f_{b \to 0}$, $f_{c \to 1}$, and $f_{d \to 1}$ is determined. Once these numbers are determined, the relative reliabilities of these buckets can be directly estimated using the following general equation:

$$LLR(X) = \begin{cases} \log\left(\frac{1 - \frac{f_{X \to 1}}{n(S'_X)}}{\frac{f_{X \to 1}}{n(S'_X)}}\right), & \text{if } X \in 0 \\ \log\left(\frac{1 - \frac{f_{X \to 0}}{n(S'_X)}}{\frac{f_{X \to 0}}{n(S'_X)}}\right), & \text{if } X \in 1 \end{cases} \quad (4)$$

Although equation 4 is general, it assumes that the input information (e.g., hard value of a given symbol—is correct. This might not be true. However, for a given symbol X, $$\frac{f_{X \to 1}}{n(S'_X)} + \frac{f_{X \to 0}}{n(S'_X)} = 1.$$

Hence equation 4 is updated to infer the hard value of the bucket using the flips as follows:

$$LLR(X) = \log\left(\frac{\frac{f_{X \to 0}}{n(S'_X)}}{\frac{f_{X \to 1}}{n(S'_X)}}\right) = \log\left(\frac{f_{X \to 0}}{f_{X \to 1}}\right) \quad (5)$$

Note that Equation 5 takes care of the sign automatically because LLRs for hard values 0 and 1 are positive and negative, respectively. Thus, if $$\frac{f_{X \to 0}}{f_{X \to 1}} \leq 1,$$

then equation 5 automatically adjusts the signs. Equation 5 is general (it subsumes Equation 3) and can be applied to any given bucket, including the hard read case.

The process can be extended to a multi-die scenario. In the foregoing, the RBER/LLR estimation of the data is described without any reference to the die from which the data was stored in. However, the same method can be used for estimating the RBER of a section of the codeword by limiting the bit flip statistics to only that section of the codeword. Therefore, the same process can be repeated for each die in order to estimate the RBERs of the dies storing the codeword data.

Thus, in embodiments a method that can estimate the RBER of every symbol in every section of the codeword is provided.

Figure 2:
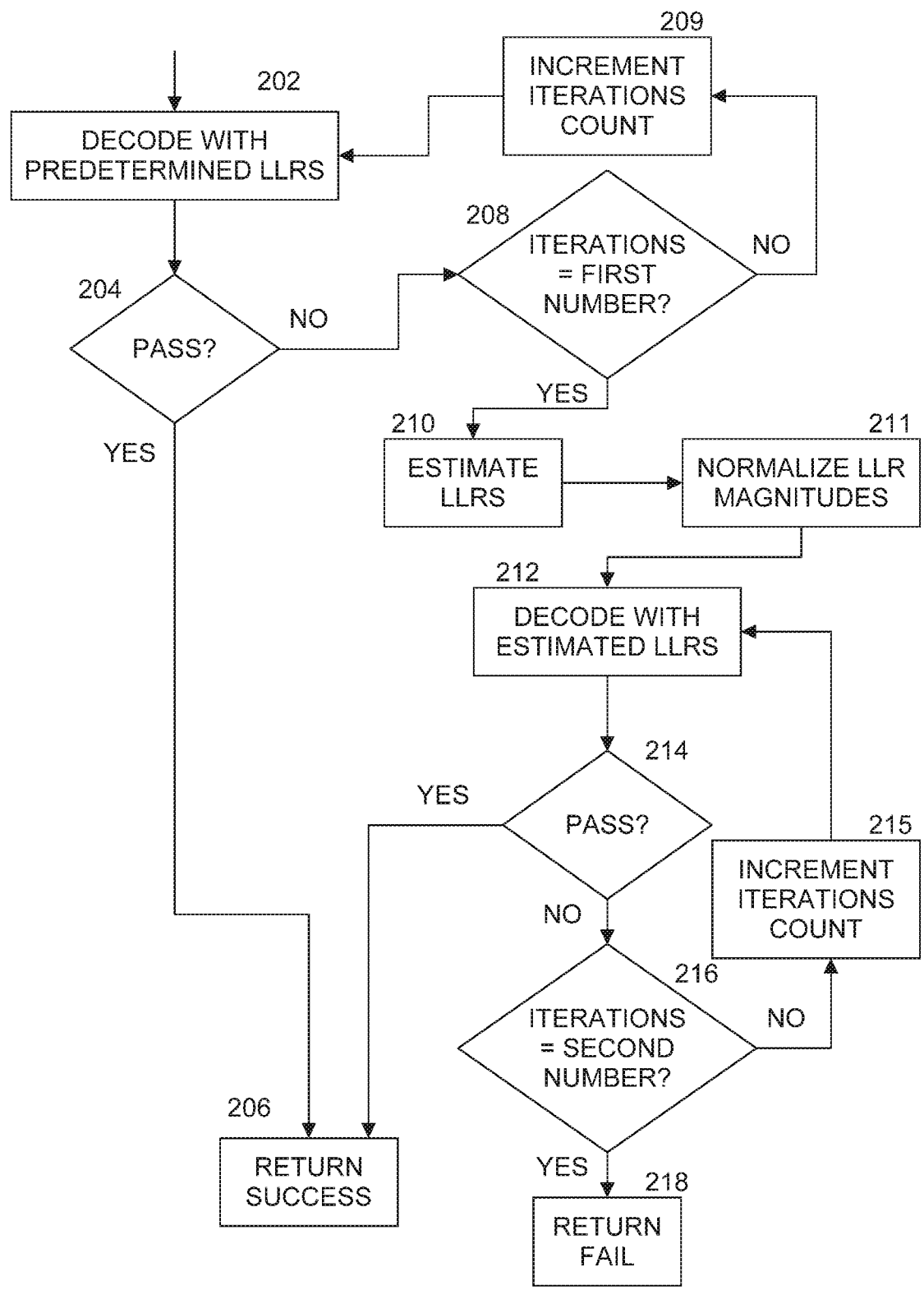
FIG. 2 illustrates an example of a logic flow for managing decoding.

FIG. 2 illustrates an example of a logic flow 200 for managing decoding by logic within ECC read component 130. This flow may be repeated for every codeword to be decoded by decoder 132. In an embodiment, a codeword may comprise 4 KB of data being transferred over a channel. At the beginning of processing each codeword, an iteration count may be set to one. Processing of a codeword received from storage memory device 122 or memory 126 begins at block 202 where decoder 132 within ECC read component 130 operates on the codeword using a set of predetermined LLRs as input parameters. These predetermined LLRs may be known a priori as characteristics of a particular storage memory device 122 or memory 126. In an embodiment, the predetermined LLRs all have equal values, which reflect a binary symmetric channel.

If the decoding of the codeword using the predetermined LLRs passes at block 204 (that is, the decoding attempt results in correct data based on a computation of an error syndrome), a success indicator and the data may be returned at block 206. ECC read component 130 may then transfer the data as needed. If the decoding of the codeword does not pass at block 204, a check is made at block 208 to determine if the number of iterations of attempting to decode the codeword is equal to a first threshold (i.e., a first number). In examples, any number may be chosen for the first threshold as an implementation decision. If not, the count of the number of iterations of attempting to decode the codeword may be incremented at block 209, and processing continues with another decoding attempt at block 202. If the first threshold is reached at block 208, processing continues with block 210.

According to embodiments of the present invention, instead of further using predetermined LLRs for subsequent iterations, ECC read component 130 may use logic within failed die identification unit (FDIU) 135 to identify any failed dies in the memory, observe residual symbol flips and estimate the die variations as evidenced by unequal LLRs at block 210 to now use as input parameters for decoder 132. In embodiments, FDIU 135 computes LLRs as shown above in equation (5) detailed above and as implemented by the example pseudo code shown below. In at least one embodiment, FDIU 135 may be implemented as logic in circuitry to perform calculations of equations 4(a) and 4(b), and/or (5). At block 211, the magnitude of the estimated LLRs are normalized. These normalized estimated LLRs are used by decoder 132 at block 212 to attempt to decode the codeword.

If the decoding of the codeword using the normalized estimated LLRs passes at block 214 (that is, the decoding attempt results in correct data based on a computation of an error syndrome), a success indicator and the data may be returned at block 206. ECC read component 130 may then transfer the data as needed. If the decoding of the codeword does not pass at block 214, a check is made at block 216 to determine if the number of iterations of attempting to decode the codeword is equal to a second threshold (i.e., a second number). In examples, any number may be chosen for the second threshold as an implementation decision, as long as the second threshold is larger than the first threshold. If not, the count of the number of iterations of attempting to decode the codeword may be incremented at block 215, and processing continues with another decoding attempt at block 212. If the second threshold is reached at block 216, processing continues with block 218, where a failure indication may be returned. The steps of FIG. 2 may be repeated for the next codeword until all codewords of the requested data have been processed.

Failed-die identification unit (FDIU) 135 is expected to receive flip-counts (ccount0 and ccount1 in the pseudocode shown below) as input from a partially decoded codeword and output the estimated LLRs of each bucket of each die. For example, in a scenario where the codeword is spread across eight dies, the FDIU 135 receives "ccounts" that correspond to these eight dies and output the reliability of the bits from each of these dies. This works even where a die is bad (e.g., low reliability of bits) and not completely failed. Furthermore, if each of the bits of the codeword has more reliability information (for example, a 3-strobe soft read, which has four buckets), the FDIU is expected to compute the LLRs of each of these buckets for every die.

FDIU 135 can be arranged in a parallel (e.g., replicated hardware) form for computation speed, or in an iterative (e.g., one copy of the hardware for all the computations, but performed sequentially) form for lower area. The following description is general and applies to both parallel and iterative forms. Next, whenever the FDIU enable flag is set to '0' (disabled), the FDIU simply acts a bypass; the FDIU copies the input LLRs of the buckets to the output without performing any computation. However, if the FDIU is enabled, then the following operations are performed.

For every die and every valid bucket, the LLR is calculated using Equation 5. For an 8-die 4-bucket case, Equation 5 is evaluated 32 (=8*4) times. These 32 evaluations can either be done in parallel using 32 hardware circuits that evaluate Equation 5, or by one hardware circuit that is reused one-after-the-other. Once the LLRs are calculated, their magnitudes need to be normalized to the highest allowed value, which is typically 16. For example, if the resulting LLRs from the computations were {3,4,5,8}, then the normalized LLR would be {6, 8, 10, 16}, which is obtained by multiplying (16/max(LLRs)) to all the numbers. However, for normalizing the LLRs, FDIU 135 scans through the computed LLRs (e.g., loop over the computed LLRs) to find the maxima of the computed LLRs.

Once the estimated LLRs are output by FDIU 135, a fresh decoding is attempted using these LLRs (block 212 of FIG. 2). Since, these LLRs now account for the reliability of the dies, the decoding is expected to be more successful.

The following is an example of pseudocode of this method. In an embodiment, the method is included in failed die identification unit (FDIU) 135 within ECC read 130. In another embodiment, FDIU 135 is part of decoder 132. The method receives the ccount0[ ][ ] and ccount1[ ][ ], which are the symbol flips for each die. The method is called for each die of a codeword.

```
© 2018 Intel Corporation
void Failed_Die_Estimation_Unit(bool fdiu_en,
    int ccount1[ ][ ], int ccount0[ ][ ], int llr_map[ ], int llr_out[ ])
{
  max_llr_mag = 0;
  if (!fdiu_en)
  {// FDIU is disabled; send the input llr_map to the output llr_out
    for (i = 0; i < MAX_NUM_OF_DIES; i++)
    {
      for (j = 0; j < MAX_NUM_OF_BUCKETS; j++)
      {
        llr_out[i][j] = llr_map[i][j];
      }
    }
  }
```

```
  else
  {// FDIU is enabled; start the estimation of LLRs
    for (i = 0; i < MAX_NUM_OF_DIES; i++)
    {
      for (j = 0; j < MAX_NUM_OF_BUCKETS; j++)
      {
        llr_out[i][j]= log(ccount0[i][j]/ccount1[i][j]);
// This is equation 5. Here is where LLRs are calculated for every
die and every bucket
        if (max_llr_mag < abs(llr_out[i][j]) && llr_map[i][j] !=
  DSB_PKG::INVALID) max_llr_mag = abs(llr_out[i][j]);
//Also keep track of the maxima for normalizing the LLRs
      }
    }
    //Now that the LLRs are all computed, go ahead and normalize all
    (every die and every bucket) LLRs
    for (i = 0; i < MAX_NUM_OF_DIES; i++)
    {
      for (i = 0; i < MAX_NUM_OF_BUCKETS; i++)
      {
        if (llr_map[i][j] == DSB_PKG::INVALID)
        {//Do not estimate for this bucket; make it invalid
          llr_out[i][j] = DSB_PKG::INVALID;
        }
        else
        {//Normalize the valid llrs to 16
          llr_out[i][j] = (llr_out[i][j]<<4)/max_llr_mag);
        }
      }
    }
  }
}
```

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

According to some examples, storage controller 124 of FIG. 1, including ECC read component 130, may execute processing operations or logic for the steps shown in FIG. 2. Storage controller 124 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, device drivers, system programs, software development programs, operating system software, middleware, firmware, software components, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

The components and features of host computing platform 110 and storage device 120 may be implemented using any combination of discrete circuitry, ASICs, logic gates and/or single chip architectures. Further, the features of host computing platform 110 and storage device 120 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus coupled to a memory, the apparatus comprising:
   circuitry; and
   logic for execution by the circuitry to:
   decode an encoded codeword of data received from a memory having a plurality of dies, bits of the encoded codeword stored across the plurality of dies, using predetermined log-likelihood ratios (LLRs) to produce a decoded codeword;
   return the decoded codeword to a host computing system when the decoded codeword is correct;
   repeat the decoding using the predetermined LLRs when the decoded codeword is not correct, up to a first number of times when the decoded codeword is not correct; and
   when a correct decoded codeword is not produced:
   estimate the LLRs for the encoded codeword for a plurality of buckets of the plurality of dies;
   normalize magnitudes of the estimated LLRs;
   decode the encoded codeword using the normalized estimated LLRs to produce a decoded codeword;
   return the decoded codeword to the host computing system when the decoded codeword is correct; and
   repeat the decoding using the normalized estimated LLRs when the decoded codeword is not correct, up to a second number of times when the decoded codeword is not correct.

2. The apparatus of claim 1, wherein the apparatus is coupled to the memory over a binary asymmetric channel.

3. The apparatus of claim 1, wherein the logic to estimate the LLRs includes logic to estimate the LLRs using a raw bit error rate (RBER) of a 0 and a RBER of a 1 for bits in the codeword.

4. The apparatus of claim 3, wherein $$RBER(0) = p_{1 \to 0} \approx \frac{n(S_1 \cap S'_0)}{n(S'_0)}$$

$$RBER(1) = p_{0 \to 1} \approx \frac{n(S_0 \cap S'_1)}{n(S'_1)}$$

where $S_0$ and $S_1$, is a set of indices of 0's and 1's in an error-five codeword, respectively, $S_0'$ and $S_1'$ is a set of indices of 0's and 1's in a noisy codeword, respectively, n is a number of bits in the codeword that flipped, and $p_{1 \to 0}$ and $p_{0 \to 1}$ are posterior probabilities.

5. The apparatus of claim 4, wherein the logic to estimate the LLRs includes logic to estimate the LLRs as $$LLR(X) = \log\left(\frac{\frac{f_{X \to 0}}{n(S'_X)}}{\frac{f_{X \to 1}}{n(S'_X)}}\right) = \log\left(\frac{f_{X \to 0}}{f_{X \to 1}}\right)$$

wherein X is a symbol in the encoded codeword.

6. A method comprising:
   decoding an encoded codeword of data received from a memory having a plurality of dies, bits of the encoded codeword stored across the plurality of dies, using predetermined log-likelihood ratios (LLRs) to produce a decoded codeword;

returning the decoded codeword to a host computing system when the decoded codeword is correct;

repeating the decoding using the predetermined LLRs when the decoded codeword is not correct, up to a first number of times when the decoded codeword is not correct; and when a correct decoded codeword is not produced:
estimating the LLRs for the encoded codeword for a plurality of buckets of the plurality of dies;
normalizing magnitudes of the estimated LLRs;
decoding the encoded codeword using the normalized estimated LLRs to produce a decoded codeword;
returning the decoded codeword to the host computing system when the decoded codeword is correct; and
repeating the decoding using the normalized estimated LLRs when the decoded codeword is not correct, up to a second number of times when the decoded codeword is not correct.

7. The method of claim 6, wherein the encoded codeword is received over a binary asymmetric channel.

8. The method of claim 7, wherein estimating the LLRs includes estimating the LLRs using a raw bit error rate (RBER) of a 0 and a RBER of a 1 for bits in the codeword.

9. The method of claim 8, wherein $$RBER(0) = p_{1 \to 0} \approx \frac{n(S_1 \cap S'_0)}{n(S'_0)}$$

$$RBER(1) = p_{0 \to 1} \approx \frac{n(S_0 \cap S'_1)}{n(S'_1)}$$

where $S_0$ and $S_1$, is a set of indices of 0's and 1's in an error-free codeword, respectively, $S_0'$ and $S_1'$ is a set of indices of 0's and 1's in a noisy codeword, respectively, n is a number of bits in the codeword that flipped, and $p_{1 \to 0}$ and $p_{0 \to 1}$ are posterior probabilities.

10. The method of claim 9, wherein estimating the LLRs includes estimating the LLRs as $$LLR(X) = \log\left(\frac{\frac{f_{X \to 0}}{n(S'_X)}}{\frac{f_{X \to 1}}{n(S'_X)}}\right) = \log\left(\frac{f_{X \to 0}}{f_{X \to 1}}\right)$$

wherein X is a symbol in the encoded codeword.

11. A storage device comprising:
a memory including a plurality of dies, bits of an encoded codeword stored across the plurality of dies;
a binary asymmetric channel coupled to the memory;
a storage controller coupled to the binary asymmetric channel to:
decode the encoded codeword of data received from the memory over the binary asymmetric channel using predetermined log-likelihood ratios (LLRs) to produce a decoded codeword;
return the decoded codeword to a host computing system when the decoded codeword is correct;
repeat the decoding using the predetermined LLRs when the decoded codeword is not correct, up to a first number of times when the decoded codeword is not correct; and
when a correct decoded codeword is not produced:
estimate the LLRs for a plurality of buckets of the plurality of dies;
normalize magnitudes of the estimated LLRs;
decode the encoded codeword using the normalized estimated LLRs to produce a decoded codeword;
return the decoded codeword to the host computing system when the decoded codeword is correct; and
repeat the decoding using the normalized estimated LLRs when the decoded codeword is not correct, up to a second number of times when the decoded codeword is not correct.

12. The storage device of claim 11, wherein the storage controller includes a failed die estimation unit to estimate the LLRs using a raw bit error rate (RBER) of a 0 and a RBER of a 1 for bits in the codeword.

13. The storage device of claim 12, wherein $$RBER(0) = p_{1 \to 0} \approx \frac{n(S_1 \cap S'_0)}{n(S'_0)}$$

$$RBER(1) = p_{0 \to 1} \approx \frac{n(S_0 \cap S'_1)}{n(S'_1)}$$

where $S_0$ and $S_1$, is a set of indices of 0's and 1's in an error-five codeword, respectively, $S_0'$ and $S_1'$ is a set of indices of 0's and 1's in a noisy codeword, respectively, n is a number of bits in the codeword that flipped, and $p_{1 \to 0}$ and $p_{0 \to 1}$ are posterior probabilities.

14. The storage device of claim 13, wherein the storage controller includes failed die estimation unit to estimate the LLRs as $$LLR(X) = \log\left(\frac{\frac{f_{X \to 0}}{n(S'_X)}}{\frac{f_{X \to 1}}{n(S'_X)}}\right) = \log\left(\frac{f_{X \to 0}}{f_{X \to 1}}\right)$$

wherein X is a symbol in the encoded codeword.

15. The storage device of claim 11, wherein the memory comprises a NAND memory.

16. The storage device of claim 11, wherein the memory comprises a three-dimensional cross point memory.

17. The storage device of claim 11, wherein the storage controller comprises a low-density parity check (LDPC) min-sum decoder.

* * * * *